(12) United States Patent
Sakai et al.

(10) Patent No.: US 10,554,012 B2
(45) Date of Patent: Feb. 4, 2020

(54) OPTICAL ELEMENT MOUNTING PACKAGE, ELECTRONIC DEVICE, AND ELECTRONIC MODULE

(71) Applicant: KYOCERA Corporation, Kyoto-shi, Kyoto (JP)

(72) Inventors: Mitsuharu Sakai, Kyoto (JP); Yuusuke Takei, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 18 days.

(21) Appl. No.: 15/568,241

(22) PCT Filed: Apr. 18, 2016

(86) PCT No.: PCT/JP2016/062261
§ 371 (c)(1),
(2) Date: Oct. 20, 2017

(87) PCT Pub. No.: WO2016/171103
PCT Pub. Date: Oct. 27, 2016

(65) Prior Publication Data
US 2018/0145478 A1 May 24, 2018

(30) Foreign Application Priority Data

Apr. 24, 2015 (JP) .................................. 2015-089443
Feb. 24, 2016 (JP) .................................. 2016-033289

(51) Int. Cl.
*H01S 5/022* (2006.01)
*H01S 5/024* (2006.01)

(52) U.S. Cl.
CPC ...... *H01S 5/02236* (2013.01); *H01S 5/02469* (2013.01); *H01S 5/02216* (2013.01); *H01S 5/02276* (2013.01)

(58) Field of Classification Search
CPC ............. H01S 5/02236; H01S 5/02252; H01S 5/02296; H01S 5/02208–02216;
(Continued)

(56) References Cited

U.S. PATENT DOCUMENTS 5,566,264 A * 10/1996 Kuke ................... G02B 6/4208
372/108
7,804,867 B2 * 9/2010 Scofet ................. H01S 5/02469
257/675
(Continued)

FOREIGN PATENT DOCUMENTS

DE 102015208704 A1 * 11/2016 ......... H01S 5/02216
JP 2001-068691 A 3/2001
(Continued)

OTHER PUBLICATIONS

International Search Report, PCT/JP2016/062261, dated Jul. 12, 2016, 2 pgs.

*Primary Examiner* — Joshua King
(74) *Attorney, Agent, or Firm* — Volpe and Koenig, P.C.

(57) ABSTRACT

An optical element mounting package includes a substrate including a recess comprising a bottom surface on which an optical element is to be mounted, and a side wall comprising an opening. The bottom surface of the recess has a cutout adjacent to the opening.

9 Claims, 13 Drawing Sheets

(58) Field of Classification Search
CPC ..... H01S 5/024; H01S 5/02469–02492; H01S 5/4025–4093
See application file for complete search history.

(56) References Cited

U.S. PATENT DOCUMENTS

| | | | | |
|---|---|---|---|---|
| 2002/0097766 | A1* | 7/2002 | Tsukiji | B82Y 20/00 372/50.22 |
| 2005/0063649 | A1* | 3/2005 | Fukuda | G02B 6/4201 385/92 |
| 2006/0006403 | A1* | 1/2006 | Matsushima | G02B 6/4201 257/99 |
| 2009/0232173 | A1* | 9/2009 | Nakagawa | G02B 6/4201 372/34 |
| 2011/0280266 | A1* | 11/2011 | Hayashi | H01S 5/02216 372/43.01 |
| 2012/0027036 | A1* | 2/2012 | Nakazawa | H01S 5/02438 372/36 |
| 2012/0044693 | A1* | 2/2012 | Hatase | G02B 27/20 362/259 |
| 2013/0140284 | A1* | 6/2013 | Nakazawa | H01S 5/02438 219/121.64 |

FOREIGN PATENT DOCUMENTS

| | | | |
|---|---|---|---|
| JP | 2002-076493 A | | 3/2002 |
| JP | 2002076493 A | * | 3/2002 |
| JP | 2002-217479 A | | 8/2002 |
| JP | 2002217479 A | * | 8/2002 |
| JP | 2004-309506 A | | 11/2004 |
| JP | 2004309506 A | * | 11/2004 |
| JP | 2007-281076 A | | 10/2007 |
| JP | 2007281076 A | * | 10/2007 |

* cited by examiner

OPTICAL ELEMENT MOUNTING PACKAGE, ELECTRONIC DEVICE, AND ELECTRONIC MODULE

FIELD

The present invention relates to an optical element mounting package for packaging various optical components, an electronic device, and an electronic module for use in the fields of, for example, optical communications, image displays including projectors, head-up displays, and smart glasses, and illumination including headlights.

BACKGROUND

Electronic devices incorporating optical elements such as laser diodes nowadays find uses in the fields of, for example, image displays and illumination, in addition to optical communications.

A package for mounting an optical element for an electronic device may include a substrate comprising a recess for accommodating an optical element, and an opening in its side walls. An optical element is mounted in the recess and is covered with, for example, a lid (refer to Japanese Unexamined Patent Application Publication No. 2001-68691).

BRIEF SUMMARY

Technical Problem

For the above package comprising an optical element mounted in the recess, light from the optical element can be partially blocked by the bottom surface of the recess and at the opening in the side wall of the recess, and can be reflected diffusely. This can reduce the amount of light. An electronic device including the optical element may not emit an intended amount of light.

Solution to Problem

An optical element mounting package according to one aspect of the present invention includes a substrate including a recess comprising a bottom surface on which an optical element is to be mounted, and a side wall comprising an opening. The bottom surface of the recess has a cutout adjacent to the opening.

An electronic device according to one aspect of the present invention includes the optical element mounting package with the above structure, an optical element mounted on the optical element mounting package, a window member covering the opening, and a lid covering the recess.

An electronic module according to one aspect of the present invention includes a module substrate including a connection pad, and the electronic device with the above structure that is connected to the connection pad with a brazing material, or includes a heat transfer member, and the electronic device with the above structure that is mounted on the heat transfer member.

Advantageous Effects

An optical element mounting package according to one aspect of the present invention includes a substrate comprising a recess with a bottom surface for mounting an optical element, and a side wall comprising an opening. The bottom surface of the recess has a cutout adjacent to the opening. This structure prevents light from the optical element from being partially blocked by the bottom surface of the recess for accommodating the optical element and at the opening in the side wall, and thus reduces the amount of light loss. An electronic device including this optical element can emit an intended amount of light.

An electronic device according to one aspect of the present invention includes the optical element mounting package with the above structure, an optical element mounted on the optical element mounting package, a window member that covers the opening, and a lid that covers the recess. This electronic device can emit an intended amount of light.

An electronic module according to one aspect of the present invention includes a module substrate including a connection pad, and the electronic device with the above structure that is connected to the connection pad with a brazing material, or includes a heat transfer member and the electronic device with the above structure that is mounted on the heat transfer member. This electronic module can emit an intended amount of light.

DETAILED DESCRIPTION

Figure 1:
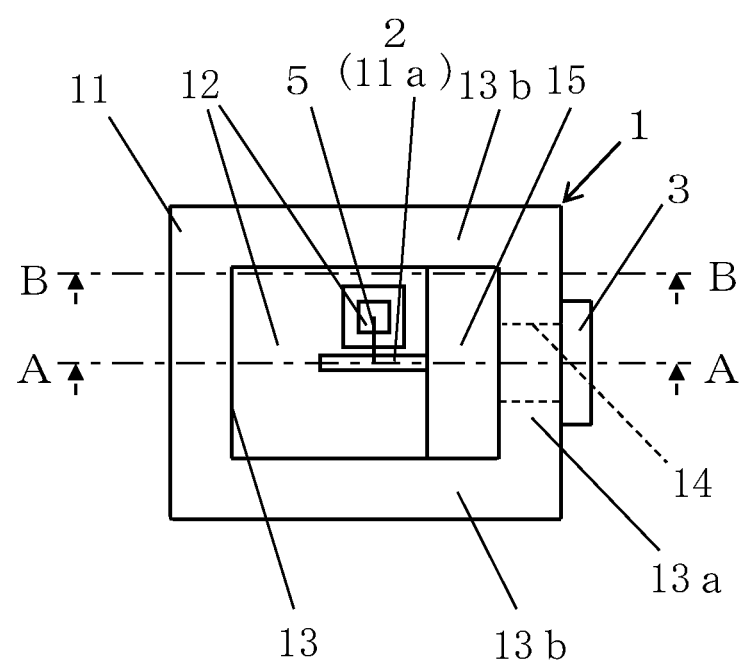
FIG. 1 is a top view of an electronic device without a lid according to one embodiment of the present invention.

Embodiments of the present invention will now be described by way of example with reference to the accompanying drawings.

An electronic device according to one embodiment of the present invention will now be described with reference to FIGS. 1 to 13B. The electronic device according to the present embodiment includes an optical element mounting package 1, an optical element 2, which is mounted on the optical element mounting package 1, a window member 3, and a lid 4.

The optical element mounting package 1 according to the present embodiment includes a substrate 11, which has a recess 13 for accommodating the optical element 2, such as a laser diode, and an opening 14.

The substrate 11 has the recess 13 comprising a bottom surface on which the optical element 2 is to be mounted, and the opening 14 in a side wall 13a of the recess 13.

The substrate 11 serves as a mount for mounting the optical element 2. The optical element 2 is joined onto a wiring conductor 12 arranged on the bottom surface of the recess 13 with a bond, such as solder.

For example, the substrate 11 may be formed from ceramics such as sintered aluminum oxide (alumina ceramics), sintered aluminum nitride, sintered mullite, or sintered glass ceramic. The substrate 11 may be formed by laminating multiple insulating layers formed from sintered ceramics, or by applying a pressure onto a ceramic green sheet using a mold that allows predetermined shaping.

The substrate 11 may be prepared using a resin material, such as an epoxy resin, a polyimide resin, an acrylic resin, a phenol resin, polyester resin, or a fluorine-based resin including a tetrafluoroethylene resin.

For the substrate 11 formed by laminating multiple insulating layers that are formed from, for example, sintered aluminum oxide, the powders of raw materials such as aluminum oxide, silicon oxide, magnesium oxide, and calcium oxide are mixed with an appropriate organic binder and a solvent to form slurry. The slurry is then shaped into a sheet using, for example, a doctor blade or by calendering to obtain a ceramic green sheet. The ceramic green sheet then undergoes punching as appropriate. Multiple ceramic green sheets prepared in this manner are laminated on one another, and are then fired at high temperature (about 1600° C.) to complete the substrate 11. The substrate 11 may also be formed by applying a pressure on the ceramic green sheets using a mold that allows predetermined shaping, and firing the sheets at high temperature in the same manner as described above.

The recess 13 has a mount 11a, which serves as a mount area for the optical element 2. In the examples shown in FIGS. 1 to 13B, the recess 13 has inner walls perpendicular to its bottom surface, and has the mount 11a on which the optical element 2 is mounted.

The recess 13 can be formed by, for example, laser processing or punching using a die on multiple ceramic green sheets for the substrate 11 to form a through-hole defining the recess 13, and by laminating these ceramic green sheets on a ceramic green sheet comprising no through-hole. For a thin substrate 11, a through-hole defining the recess 13 is formed accurately in laminated multiple ceramic green sheets by, for example, laser processing or punching using a die.

The opening 14 is formed in the side wall 13a of the recess 13. This structure allows light emitted from the optical element 2 to pass through the opening 14 out of the substrate 11.

The opening 14 can be formed in the same manner as the recess 13 by laser processing or punching using a die on ceramic green sheets to form a through-hole defining the opening 14 that communicates with the through-hole defining the recess 13, and by laminating these ceramic green sheets on a ceramic green sheet comprising no through-hole.

The recess 13 has a cutout 15 on its bottom surface. The cutout 15 is adjacent to the opening 14. This structure prevents light emitted from the optical element 2 from being partially blocked by the bottom surface of the recess 13, on which the optical element 2 is mounted, and at the opening 14 in the side wall 13a, and thus reduces the amount of light loss. An electronic device including the optical element 2 can emit an intended amount of light.

The cutout 15 can be formed in the same manner as the recess 13 by laser processing or punching using a die on ceramic green sheets to form a through-hole defining the cutout 15 that communicates with the through-hole defining the opening 14, and by laminating these ceramic green sheets on a ceramic green sheet comprising no through-hole.

Figure 2A:
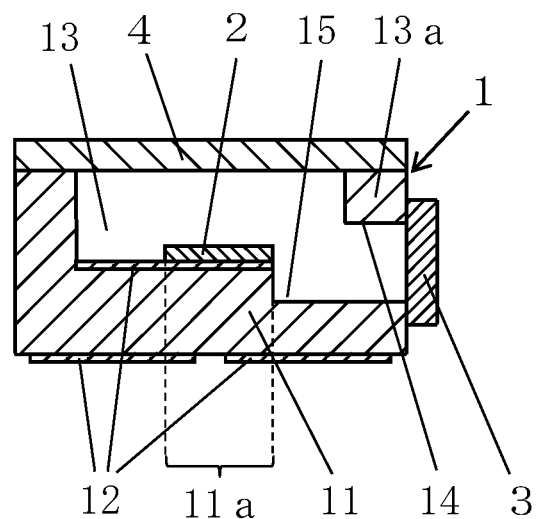
FIG. 2A is a longitudinal cross-sectional view of the electronic device with a lid taken along line A-A in FIG. 1.
Figure 2B:
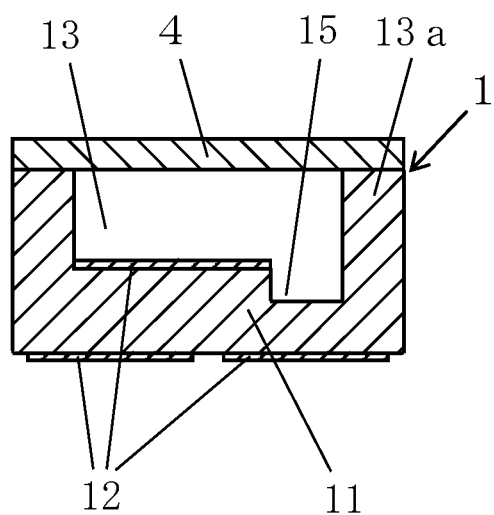
FIG. 2B is a longitudinal cross-sectional view of the electronic device with the lid taken along line B-B in FIG. 1.

As in the example shown in FIGS. 1 to 2B, the recess 13 may comprise a quadrangle profile in a plan view, and the cutout 15 may be adjacent to other side walls 13b (hereafter, side walls 13b) of the recess 13, which are continuous with the side wall 13a comprising the opening 14. In this case, the cutout 15, which is wide, more effectively prevents light emitted from the optical element 2 from being partially blocked by the bottom surface of the recess 13, on which the optical element 2 is mounted, and further reduces the amount of light loss. An electronic device including the optical element 2 can emit an intended amount of light. As in the example shown in FIGS. 7 to 8B, the side walls 13b of the recess 13 may comprise a portion adjacent to the cutout 15 that has a thickness D1 greater than a thickness D2 of a portion that is not adjacent to the cutout 15. When a window member 3 is arranged at the opening 14, the portions of the side walls 13b with the greater thickness effectively disperse stress applied to the window member 3 when the window member 3 is joined, or stress applied to the window member 3, which protrudes from the substrate 11, when the optical element mounting package 1 is used. The optical element mounting package 1 is less likely to deform or crack.

Figure 9:
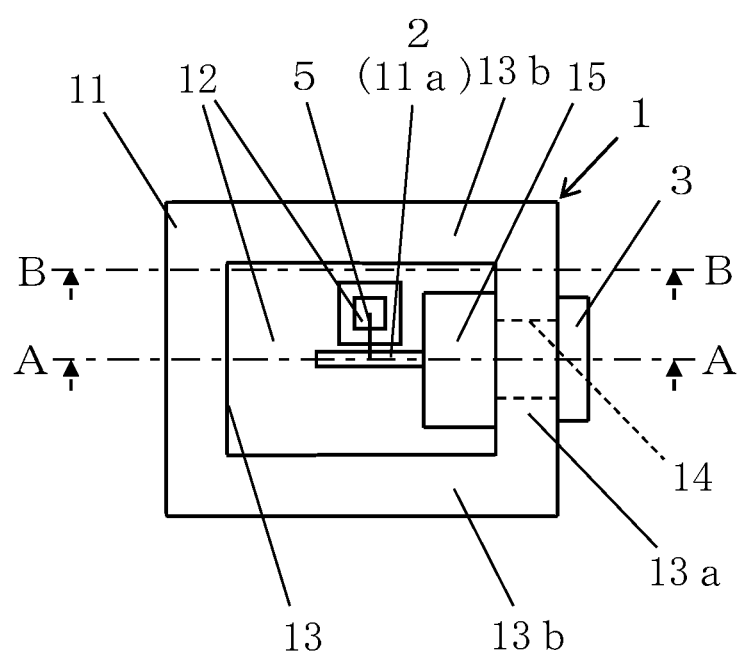
FIG. 9 is a top view of an electronic device without a lid according to another embodiment of the present invention.
Figure 10A:
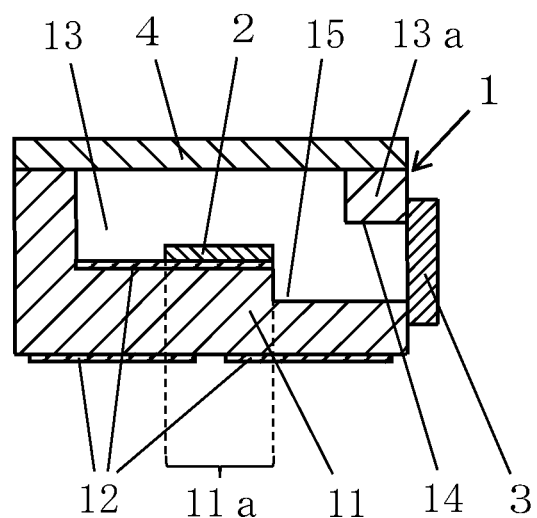
FIG. 10A is a longitudinal cross-sectional view of the electronic device with a lid taken along line A-A in FIG. 9.
Figure 10B:
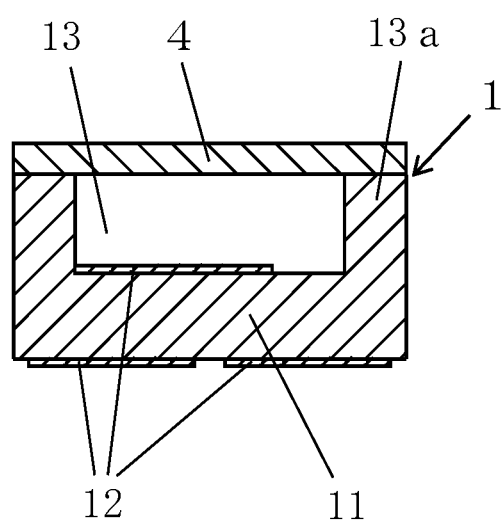
FIG. 10B is a longitudinal cross-sectional view of the electronic device with the lid taken along line B-B in FIG. 9.
Figure 11:
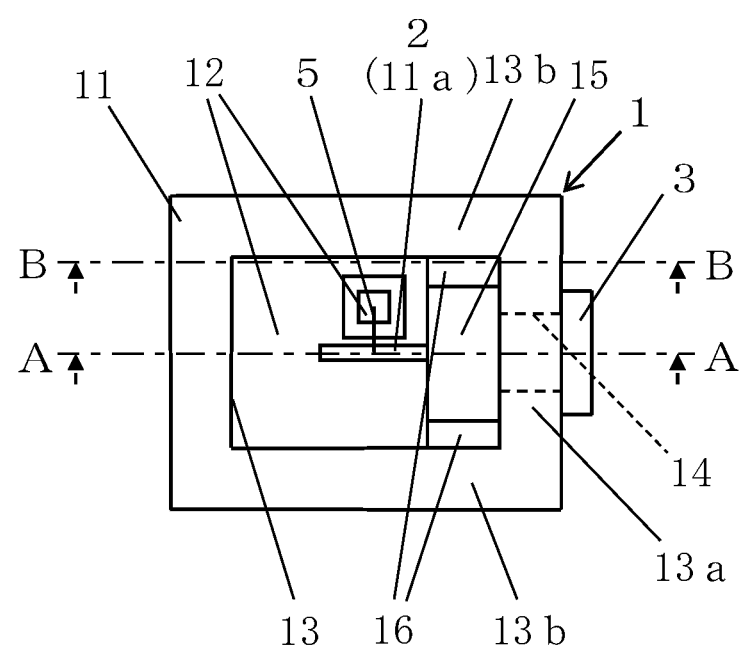
FIG. 11 is a top view of an electronic device without a lid according to another embodiment of the present invention.
Figure 12A:
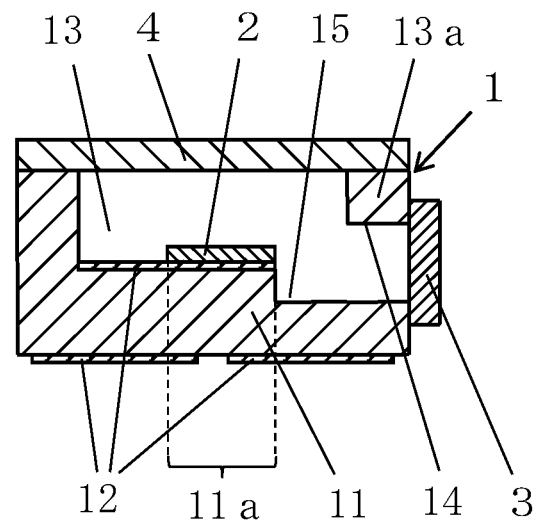
FIG. 12A is a longitudinal cross-sectional view of the electronic device with a lid taken along line A-A in FIG. 11.
Figure 12B:
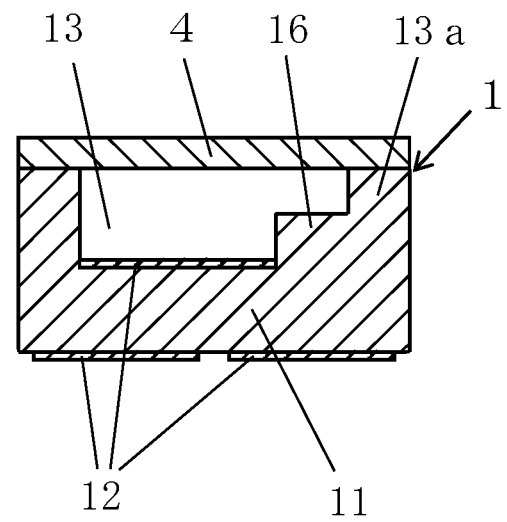
FIG. 12B is a longitudinal cross-sectional view of the electronic device with the lid taken along line B-B in FIG. 11.

As in the example shown in FIGS. 9 to 10B, the recess 13 may comprise a quadrangle profile in a plan view, and the cutout 15 may be arranged away from the side walls 13b of the recess 13, which are continuous with the side wall 13a comprising the opening 14. This structure prevents light emitted from the optical element 2 from being partially blocked by the bottom surface of the recess 13, on which the optical element 2 is mounted, and at the opening 14 in the side wall 13a, and thus reduces the amount of light loss. An electronic device including the optical element 2 can emit an intended amount of light. When a window member 3 is arranged at the opening 14, the portions between the side surfaces of the substrate 11 and the cutout 15 disperse stress applied to the window member 3 when the window member 3 is joined, or stress applied to the window member 3, which protrudes from the substrate 11, when the optical element mounting package 1 is used. The optical element mounting package 1 is less likely to deform or crack. As in the example shown in FIGS. 11 to 12B, the recess 13 may include, between the side walls 13b and the cutout 15 in a plan view, steps 16 that are raised from the bottom surface of the recess 13 toward its opening. When a window member 3 is arranged at the opening 14, the steps 16 further disperse stress applied to the window member 3 when the window member 3 is joined, or stress applied to the window member 3, which protrudes from the substrate 11, when the optical element mounting package 1 is used. The optical element mounting package 1 is less likely to deform or crack.

As in the examples shown in FIGS. 1 to 13B, the recess 13 may comprise the mount 11a, on which the optical element 2 is to be mounted, and the cutout 15 adjacent to the mount 11a in a plan view. This structure more effectively prevents light immediately after emitted from the optical element 2 from being partially blocked by the bottom surface of the recess 13 on which the optical element 2 is mounted, and thus reduces the amount of light loss. An electronic device including the optical element 2 can emit an intended amount of light.

Figure 13A:
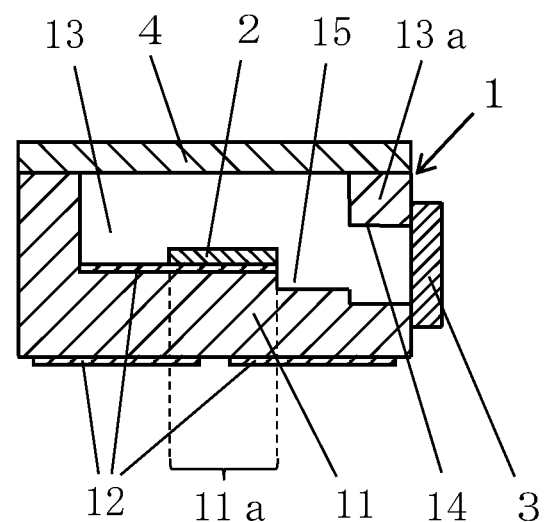
FIGS. 13A and 13B are longitudinal cross-sectional views of an electronic device according to another embodiment of the present invention.

As in the example shown in FIG. 13A, the cutout 15 may be adjacent to the mount 11a for the optical element 2 and the opening 14, and the bottom surface of the cutout 15 may be positioned between the bottom surface of the recess 13 and the lower end of the opening 14. This structure more effectively prevents light immediately after emitted from the optical element 2 from being partially blocked by the bottom surface of the recess 13, on which the optical element 2 is mounted, and thus reduces the amount of light loss. An electronic device including the optical element 2 can emit an intended amount of light. This structure can also prevent the substrate 11 from comprising a thin portion corresponding to the cutout 15. When a window member 3 is arranged at the opening 14, the portion between the lower surface of the substrate 11 and the cutout 15 disperses stress applied to the window member 3 when the window member 3 is joined, or stress applied to the window member 3, which protrudes from the substrate 11, when the optical element mounting package 1 is used. The optical element mounting package 1 is less likely to deform or crack.

Figure 13B:
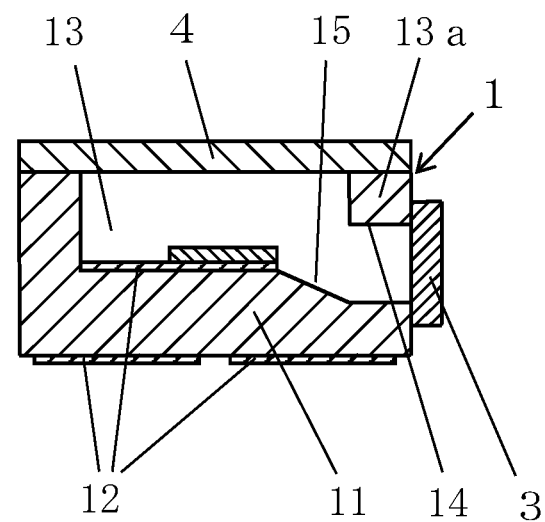

As in the example shown in FIG. 13B, the cutout 15 may be adjacent to the mount 11a for the optical element 2 and to the opening 14, and may comprise a slope at the opening 14 that slopes from an end of the mount 11a for the optical element 2 to the opening 14. This structure more effectively prevents light immediately after emitted from the optical element 2 from being partially blocked by the bottom surface of the recess 13, on which the optical element 2 is mounted, and thus reduces the amount of light loss. An electronic device including the optical element 2 can emit an intended amount of light. This structure can also prevent the substrate 11 from comprising a thin portion corresponding to the cutout 15. When a window member 3 is arranged at the opening 14, the portion between the lower surface of the substrate 11 and the cutout 15 disperses stress applied to the window member 3 when the window member 3 is joined, or stress applied to the window member 3, which protrudes from the substrate 11, when the optical element mounting package 1 is used. The optical element mounting package 1 is less likely to deform or crack.

The wiring conductor 12 arranged on the bottom surface of the recess 13 may extend from the mount 11a to the cutout 15. This structure allows heat emitted from the optical element 2 during operation of the optical element 2 to be transmitted to the cutout 15 as well as to the mount 11a. This structure easily dissipates heat emitted from the optical element 2 outside.

The cutout 15 adjacent to the mount 11a, and the wiring conductor 12 extending from the mount 11a to the cutout 15 on the bottom surface of the recess 13 together allow the bond for joining the optical element 2 to easily form a fillet. This improves the reliability of the joint of the optical element 2.

Wiring conductors 12 are arranged inside and on the surface of the substrate 11. The wiring conductors 12 each comprise one end extending, for example, at the bottom surface of the recess 13, and the other end extending at the lower surface of the substrate 11. The wiring conductors 12 electrically connect the optical element 2 mounted on the optical element mounting package 1 and a module substrate 6. The wiring conductors 12 include wiring conductors arranged inside or on the surface of the substrate 11, and through conductors extending through the insulating layers of the substrate 11 to electrically connect the upper and lower wiring conductors.

The wiring conductors 12 may be formed from a metal material such as tungsten (W), molybdenum (Mo), manganese (Mn), silver (Ag), or copper (Cu). For a substrate 11 formed from sintered aluminum oxide, for example, a conductive paste for the wiring conductors 12 containing powdery refractory metal, such as W, Mo, or Mn, mixed with an appropriate organic binder and a solvent is preliminarily applied in a predetermined pattern by screen printing on a ceramic green sheet, which is to be the substrate 11. The metal, together with the ceramic green sheet to be the substrate 11, is fired to form the wiring conductors 12 applied at predetermined positions on the substrate 11. To form through conductors as the wiring conductors 12, through-holes are formed in the green sheet by punching using a die or a punch or by laser processing. The through-holes are then filled with conductive paste for the wiring conductors 12 by printing.

Uncovered portions of the surfaces of the wiring conductors 12 are covered with plating layers deposited by electroplating or electroless plating. The plating layers are formed from metals with high corrosion resistance and connectivity with a connection member 5, such as a bonding wire, to be connected to the electrodes of the optical element 2. Examples of the metals include nickel, copper, gold, and silver. For example, a nickel plating layer and a gold plating layer, or a nickel plating layer and a silver plating layer are sequentially deposited on the surface.

The wiring conductor 12 on which the optical element 2 is to be mounted may be covered with a copper plating layer deposited to comprise a thickness of about 10 to 80 μm for effectively dissipating heat from the optical element 2. The wiring conductors 12 on the lower surface may be covered with a copper plating layer deposited to comprise a thickness of about 10 to 80 μm for easily transferring heat from the optical element mounting package 1 to the module substrate 6.

A plating layer formed from a meal other than the above listed metals, such as a palladium plating layer, may be additionally deposited.

In the optical element mounting package 1, the optical element 2 is mounted on the mount 11a of the recess 13, the window member 3 is arranged to cover the opening 14, and the lid 4 is arranged to cover the recess 13 to complete an electronic device. The optical element 2 is fixed on the wiring conductor 12 with a bond, such as solder, and the electrodes of the optical element 2 are then connected to the wiring conductor 12 with the connecting member 5, such as a bonding wire. In this manner, the optical element 2 is mounted on the optical element mounting package 1.

The optical element 2 is a semiconductor optical element, such as a laser diode. A plurality of optical elements 2 may be mounted in the recess 13. In this case, light emitted from the plurality of optical elements 2 passes through the window member 3 after passing through, for example, a prism as appropriate, and is released outside the substrate 11.

The recess 13 is sealed with the lid 4, which is formed from, for example, ceramics or metal, using a sealing material formed from, for example, a brazing material. The recess 13 may be sealed with the lid 4 by welding using a seal ring. The opening 14 is sealed by the window member 3 formed from, for example, transparent glass, using a sealing material formed from, for example, low-melting point glass. In this manner, the optical element mounting package 1 is sealed. Although the window member 3 described above covers the opening 14, the window member 3 may be fit into the opening 14.

Figure 3:
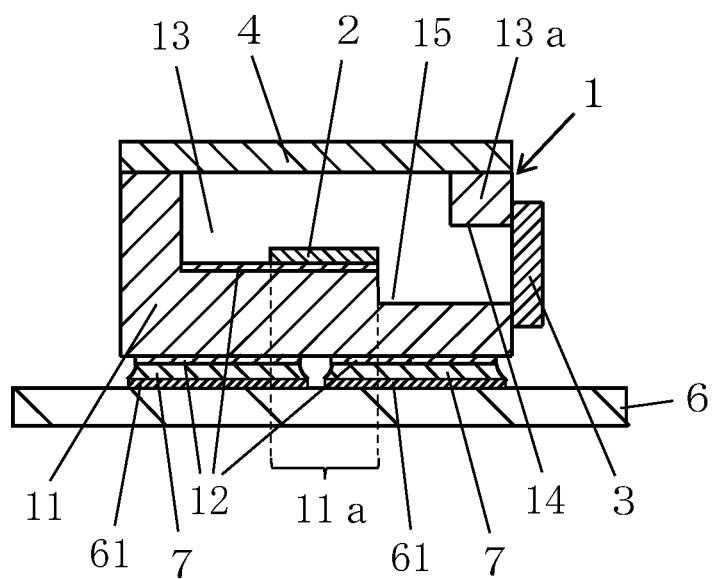
FIG. 3 is a longitudinal cross-sectional view of an electronic module including a module substrate on which the electronic device with a lid shown in FIG. 1 is mounted.
Figure 4A:
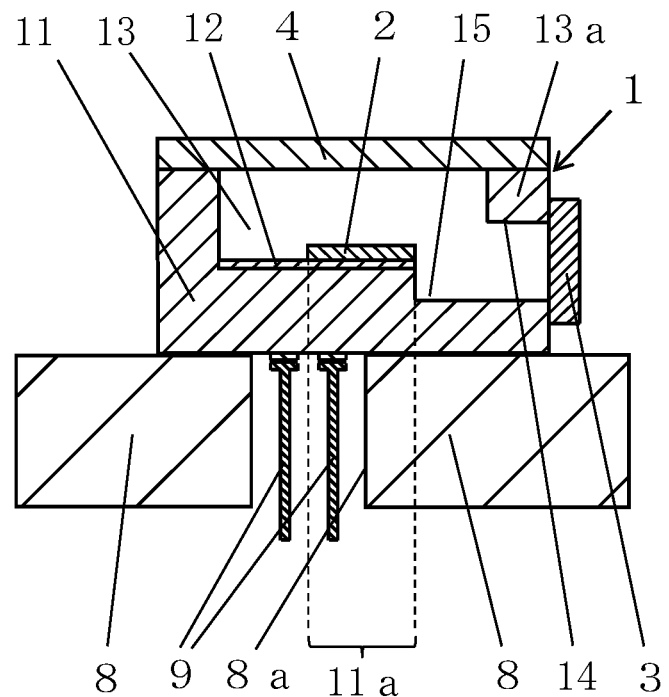
FIGS. 4A and 4B are longitudinal cross-sectional views of an electronic module according to another embodiment of the present invention.
Figure 4B:
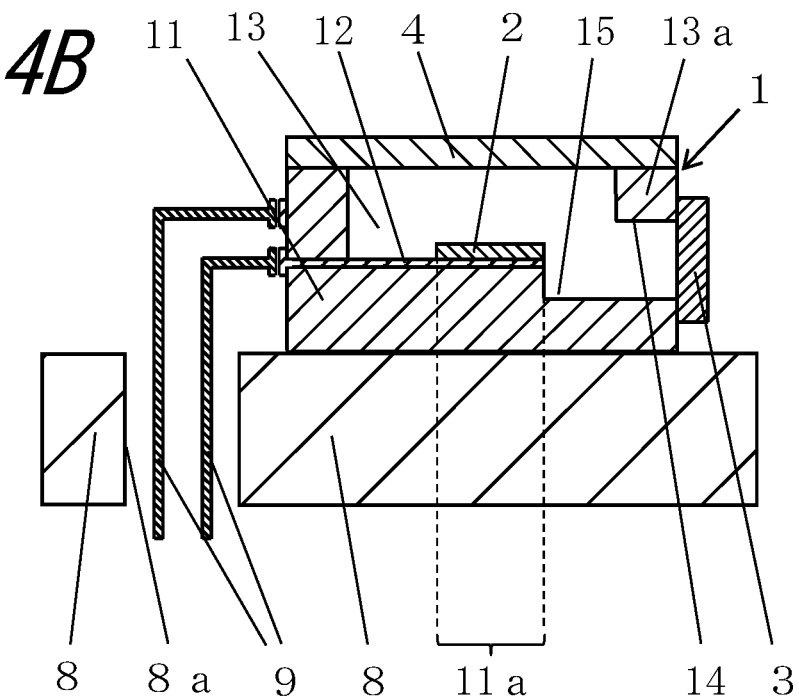
Figure 5:
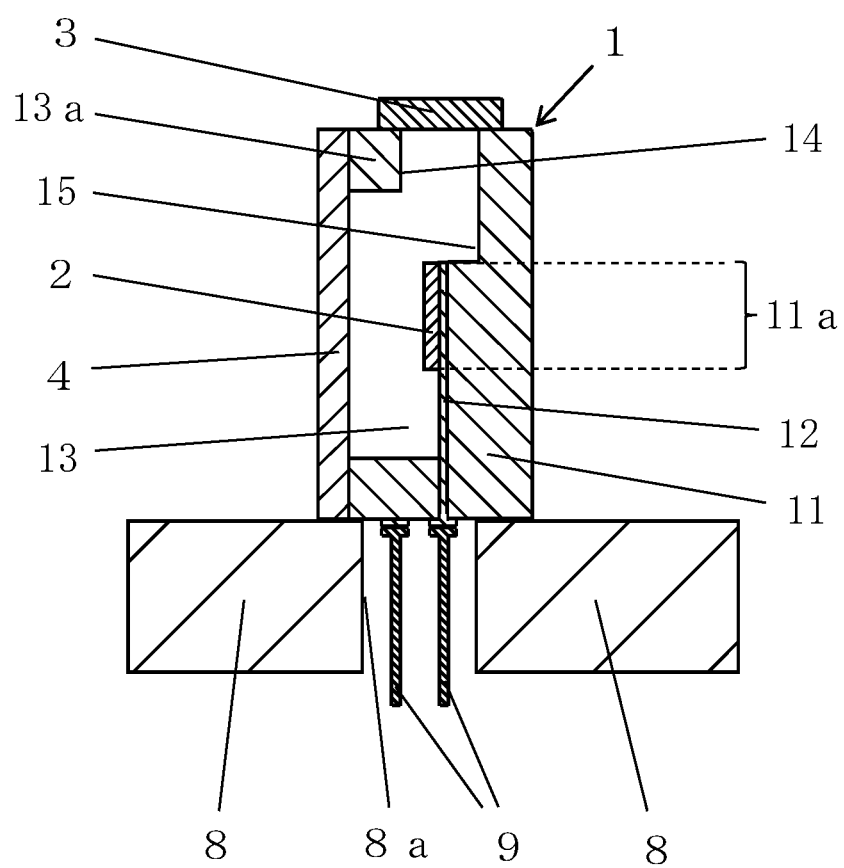
FIG. 5 is a longitudinal cross-sectional view of an electronic module according to another embodiment of the present invention.
Figure 6:
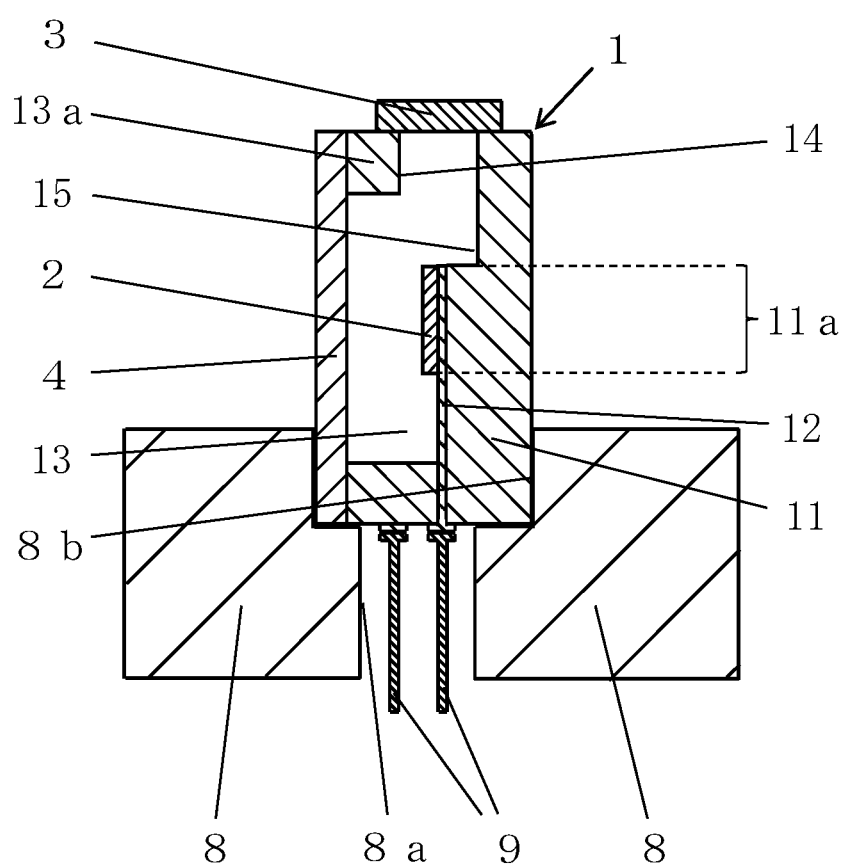
FIG. 6 is a longitudinal cross-sectional view of an electronic module according to another embodiment of the present invention.
Figure 7:
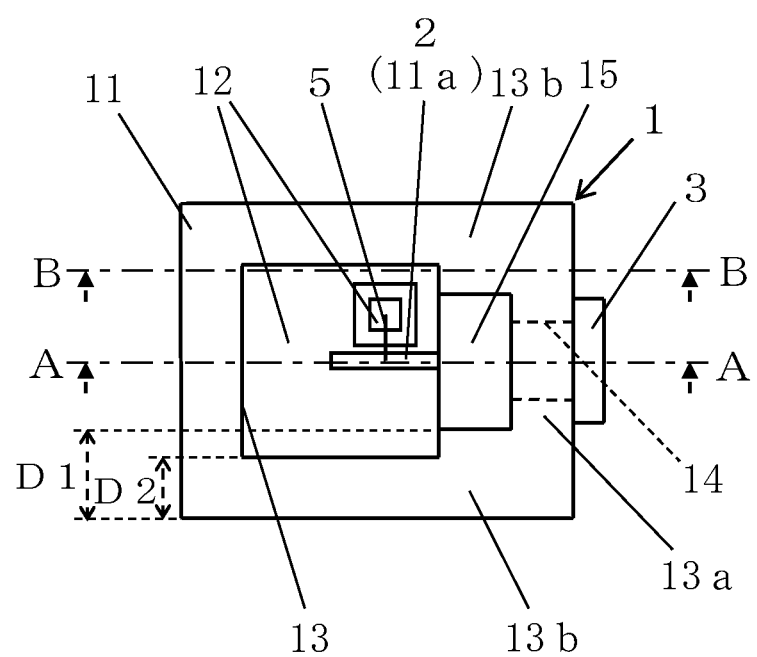
FIG. 7 is a top view of an electronic device without a lid according to another embodiment of the present invention.
Figure 8A:
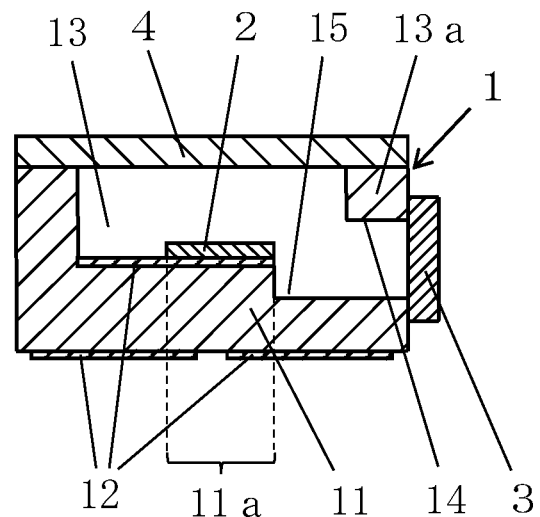
FIG. 8A is a longitudinal cross-sectional view of the electronic device with a lid taken along line A-A in FIG. 7.
Figure 8B:
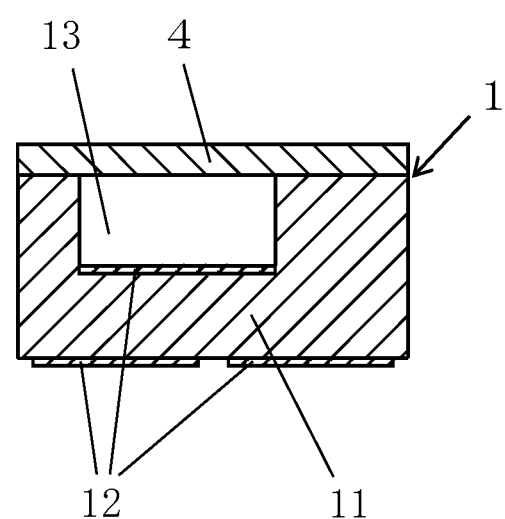
FIG. 8B is a longitudinal cross-sectional view of the electronic device with the lid taken along line B-B in FIG. 7.

Although the electronic device in the example shown in FIG. 3 is connected to connection pads 61 on the module substrate 6 using a brazing material 7, such as solder, the electronic device may be mounted on a heat transfer member 8, which is formed from, for example, aluminum or copper, as in the examples shown in FIGS. 4A to 6. In the examples shown in FIGS. 4A, 5, and 6, the electronic device is mounted to cover the entire opening of the through-hole 8a, whereas the electronic device is mounted near the through-hole 8a in the example shown in FIG. 4B. In these structures, the electronic device is mounted on the heat transfer member 8 without the module substrate 6, and thus allows the optical element 2 to effectively dissipate heat outside through the heat transfer member 8. In this case, the optical element mounting package 1 includes lead terminals 9 formed from metal, and the wiring conductors 12 and the lead terminals 9 are connected to one another with, for example, a brazing material. The lead terminals 9 electrically connect the optical element 2 mounted on the optical element mounting package 1 to an external circuit. The lead terminals 9 may be pins.

The heat transfer member 8 has a through-hole 8a. The electronic device is thus mounted with the lead terminals 9 being positioned in the through-hole 8a without in contact with the heat transfer member 8. As in the example shown in FIG. 6, the heat transfer member 8 may comprise a recess 8b. The recess 8b has an opening wider than the opening of through-hole 8a to contain the entire opening of the through-hole 8a. When the electronic device is mounted in this recess 8b, the heat transfer path is larger, and the heat of the optical element 2 is more effectively transferred through the heat transfer member 8. This structure allows the optical element 2 to effectively dissipate heat outside through the heat transfer member 8. To transfer heat more effectively through the heat transfer member 8, the electronic device may be mounted on the heat transfer member 8 with thermal grease, which is grease such as silicone containing particles of copper, aluminum, or magnesium oxide being dispersed.

A method for manufacturing the optical element mounting package 1 according to the present embodiment will now be described.

The substrate 11 is formed from, for example, sintered aluminum oxide ($Al_2O_3$). The substrate 11 has the recess 13 comprising the bottom surface including the mount 11a on which the optical element 2 is to be mounted. For the substrate 11 formed from sintered aluminum oxide mainly containing aluminum oxide ($Al_2O_3$), the powder of silica ($SiO_2$), magnesia (MgO), or calcia (CaO) is added as a sintering additive to the powder of $Al_2O_3$, to which an appropriate binder, a solvent, and a plasticizer are further added, and the mixture of these is then kneaded to obtain slurry. The slurry is then shaped into a sheet using a known film formation method using, for example, a doctor blade to obtain a ceramic green sheet for a multi-piece substrate.

The ceramic green sheet is used to obtain the optical element mounting package 1 through the processes 1 to 5 below.

1. Punching parts for the recess 13, the opening 14, and the cutout 15 using punching dies.

The cutout 15 comprising a slope from the mount 11a for the optical element 2 to the opening 14 may be formed by pressing, for example, a jig against the ceramic green sheet.

2. Conductive paste printing and filling for forming the wiring conductors 12 including the internal conductors and the through-conductors in parts to be the bottom surface, the inside, the side surfaces, and the lower surface of the recess 13 of the substrate 11.

3. Preparing a ceramic green sheet laminate by laminating the ceramic green sheets, each serving as an insulating layer, or pressurizing the ceramic green sheets using a mold for molding the sheets into the shapes of the recess 13, the opening 14, and the cutout 15 to prepare a molded body without the process 1 above.

4. Firing the ceramic green sheet laminate at temperatures of about 1500 to 1800 □, and obtaining a multi-piece substrate in which multiple substrates 11 including the wiring conductors 12 are arranged.

5. Forming split grooves along the outer edges of the optical element mounting packages 1 on the multi-piece substrate obtained through firing, and cutting the substrate into pieces along the split grooves; or cutting the substrate along the outer edges of the optical element mounting packages 1 with, for example, slicing.

The split grooves may be formed after firing by forming cuts on the multi-piece substrate shallower than the thickness of the substrate with a slicing device. The split grooves may also be formed by pressing a cutter against the ceramic green sheet laminate for the multi-piece substrate, or by forming cuts shallower than the thickness of the ceramic green sheet laminate with a slicing device.

In the process 2 above, the wiring conductors 12 are formed at predetermined positions on the substrates 11 by printing a conductive paste in a predetermined shape on the ceramic green sheet for the substrates 11 by, for example, screen printing, and firing the paste together with the ceramic green sheet for the substrate 11. Of the wiring conductors 12, the through-conductors extending through the ceramic green sheet in the thickness direction may be formed by filling the through-hole formed in the ceramic green sheet by printing the conductive paste. The conductive paste can be prepared by adding and kneading an appropriate solvent and a binder to the powder metal of, for example, tungsten, molybdenum, manganese, silver, or copper, and kneading the mixture to adjust the viscosity of the mixture as appropriate. The conductive paste may contain glass or ceramics to increase the joint strength with the substrate 11.

A nickel plating layer with a thickness of 0.5 to 5 μm and a gold plating layer with a thickness of 0.1 to 3 μm, or a nickel plating layer with a thickness of 1 to 10 μm and a silver metal plating layer with a thickness of 0.1 to 1 μm may be sequentially deposited on the uncovered surfaces of the wiring conductors 12. This structure effectively prevents corrosion of the wiring conductors 12, and strengthens the joint between the wiring conductor 12 and the optical element 2 with a bond, and the joint between the wiring conductor 12 and the connecting member 5, such as a bonding wire, and the joint between the wiring conductors 12 and the connection pads 61 on the module substrate 6.

The electronic device with the optical element mounting package 1 prepared as above including the optical element 2 mounted on the mount 11a is mounted on the module substrate 6 with a brazing material 7, such as solder, to electrically connect the optical element 2 to the module substrate 6 through the wiring conductors 12. The electrodes of the optical element 2 are electrically connected to the wiring conductor 12 of the optical element mounting package 1 with connecting terminals, such as bonding wires.

The electronic device may be mounted on the heat transfer member 8. For example, the electronic device is mounted on the optical element mounting package 1 with lead terminals 9, which are to be joined with the wiring conductors 12 using, for example, a brazing material, and the lead terminals 9 placed in the through-hole 8a without in contact with the heat transfer member 8. In this structure, the optical element 2 is electrically connected to an external circuit through the wiring conductors 12 and the lead terminals 9.

The optical element mounting package 1 according to the present embodiment includes the substrate 11 including the recess 13 comprising the bottom surface on which the optical element 2 is to be mounted, and the side wall 13a comprising the opening 14, and the bottom surface of the recess 13 has the cutout 15 adjacent to the opening. This structure prevents light emitted from the optical element 2 from being partially blocked by the bottom surface of the recess 13, on which the optical element 2 is mounted, or at the opening 14 of the side wall 13a, and thus reduces the amount of light loss. An electronic device including the optical element 2 can emit an intended amount of light.

The electronic device according to the present embodiment includes the optical element mounting package 1 with the above structure, the optical element 2 mounted on the optical element mounting package 1, the window member 3 covering the opening, and the lid 4 covering the recess, and thus emits an intended amount of light.

The electronic module according to the present embodiment includes the module substrate 6 including the connection pads 61 and the electronic device with the above structure connected to the connection pads 61 using the brazing material 7, or includes the heat transfer member 8 and the electronic device with the above structure mounted on the heat transfer member 8, and thus emits an intended amount of light.

The invention claimed is:

1. An optical element mounting package, comprising:
a substrate including a recess comprising a bottom surface on which an optical element is to be mounted, and a side wall comprising an opening,
wherein the bottom surface of the recess has a cutout adjacent to the opening,
wherein the opening is opened at an inner wall surface of the side wall and penetrates through the side wall, and in a first direction perpendicular to the bottom surface of the recess, a bottom surface of the cutout is located at a same position as a lower end of the opening in the inner wall surface or located between the bottom surface of the recess and the lower end of the opening in the inner wall surface,
wherein as seen in the first direction, the recess has a quadrangle profile and the side wall comprising the opening extends in a second direction which is different from the first direction,
wherein the cutout is adjacent to another side wall of the recess that is continuous with the side wall comprising the opening and, as seen in the first direction, the other side wall includes a portion adjacent to the cutout that has a greater thickness in the second direction than a portion that is not adjacent to the cutout.

2. The optical element mounting package according to claim 1, wherein
the cutout is arranged away from the other side wall of the recess that is continuous with the side wall comprising the opening.

3. The optical element mounting package according to claim 2, wherein
the recess includes, between the other side wall and the cutout as seen in the first direction, a step that is raised from the bottom surface of the recess toward the opening.

4. The optical element mounting package according to claim 1, wherein
the recess has a mount on which an optical element is to be mounted, and
the cutout is adjacent to the mount as seen in the first direction.

5. An electronic device, comprising:
the optical element mounting package according to claim 1;
an optical element mounted on the optical element mounting package;
a window member covering the opening; and a lid covering the recess.

6. An electronic module, comprising:
a module substrate including a connection pad; and
the electronic device according to claim 5 that is connected to the connection pad with a brazing material.

7. An electronic module, comprising:
a heat transfer member; and
the electronic device according to claim 5 that is mounted on the heat transfer member.

8. The optical element mounting package according to claim 2, wherein
the recess has a mount on which an optical element is to be mounted, and
the cutout is adjacent to the mount as seen in the first direction.

9. The optical element mounting package according to claim 3, wherein
the recess has a mount on which an optical element is to be mounted, and
the cutout is adjacent to the mount as seen in the first direction.

* * * * *